US008335808B2

(12) United States Patent
Shieh

(10) Patent No.: US 8,335,808 B2
(45) Date of Patent: Dec. 18, 2012

(54) METHOD AND APPARATUS FOR PROCESSING MULTIPLE DECOMPOSED DATA FOR CALCULATING KEY EQUATION POLYNOMIALS IN DECODING ERROR CORRECTION CODE

(75) Inventor: Jia-Horng Shieh, Jhonghe (TW)

(73) Assignee: Mediatek Inc., Hsin-Chu (TW)

( * ) Notice: Subject to any disclaimer, the term of this patent is extended or adjusted under 35 U.S.C. 154(b) by 1897 days.

(21) Appl. No.: 11/145,694

(22) Filed: Jun. 6, 2005

(65) Prior Publication Data

US 2005/0273484 A1 Dec. 8, 2005

(30) Foreign Application Priority Data

Jun. 8, 2004 (TW) .............................. 93116388 A

(51) Int. Cl.
*G06F 7/00* (2006.01)
(52) U.S. Cl. .................... 708/200; 708/492; 708/530
(58) Field of Classification Search .......... 708/491–492, 708/200–209, 446, 650–656
See application file for complete search history.

(56) References Cited

U.S. PATENT DOCUMENTS

| 5,185,711 A * | 2/1993 | Hattori .......................... 708/492 |
| 5,889,793 A | 3/1999 | Sharma | |
| 6,119,262 A | 9/2000 | Chang et al. | |
| 6,286,123 B1 | 9/2001 | Kim | |
| 6,637,002 B1 * | 10/2003 | Weng et al. .................... 708/507 |
| 7,047,481 B2 * | 5/2006 | Marconetti .................... 714/784 |
| 7,051,267 B1 * | 5/2006 | Yu et al. ........................ 714/784 |
| 2003/0106014 A1 * | 6/2003 | Dohmen et al. .............. 714/785 |
| 2004/0078408 A1 * | 4/2004 | Miller et al. .................. 708/492 |
| 2005/0033791 A1 * | 2/2005 | Pollock ......................... 708/530 |
| 2005/0050131 A1 * | 3/2005 | Lawrow ........................ 708/492 |

OTHER PUBLICATIONS

Truong et al., "Inversionless Decodign of Both Erros and Erasures of Reed-Solomon Code", Aug. 1998, IEEE Transactions on Communications vol. 46, No. 8, pp. 973-976.*
Marconetti et al., "A Fully Programmable Reed Solomon 8-bit Codec Based on a Re-shaped Berlekamp Massey Algorithm", 2002, IEEE, pp. V-553-V-556.*
Shao et al., "On the VLSI Design of a Pipeline Reed-Solomon Decoder Using Systolic Arrays", 1987, TDA Progress Report 42-91, pp. 224-234.*

* cited by examiner

*Primary Examiner* — Michael D Yaary
(74) *Attorney, Agent, or Firm* — Hoffman Warnick LLC

(57) ABSTRACT

The invention is a method of calculating a key equation polynomial. The key equation comprises an errata locator polynomial and an errata evaluator polynomial. The errata locator polynomial decomposes to a plurality of coefficients. Some or all of the plurality of coefficients are formed by adding up decomposed data. The method comprises a coefficient calculation procedure for the errata locator polynomial of updating at least two coefficients, or two decomposed data of the coefficient calculation procedure, or a combination of the above in a single clock cycle simultaneously to get the errata locator polynomial.

32 Claims, 8 Drawing Sheets

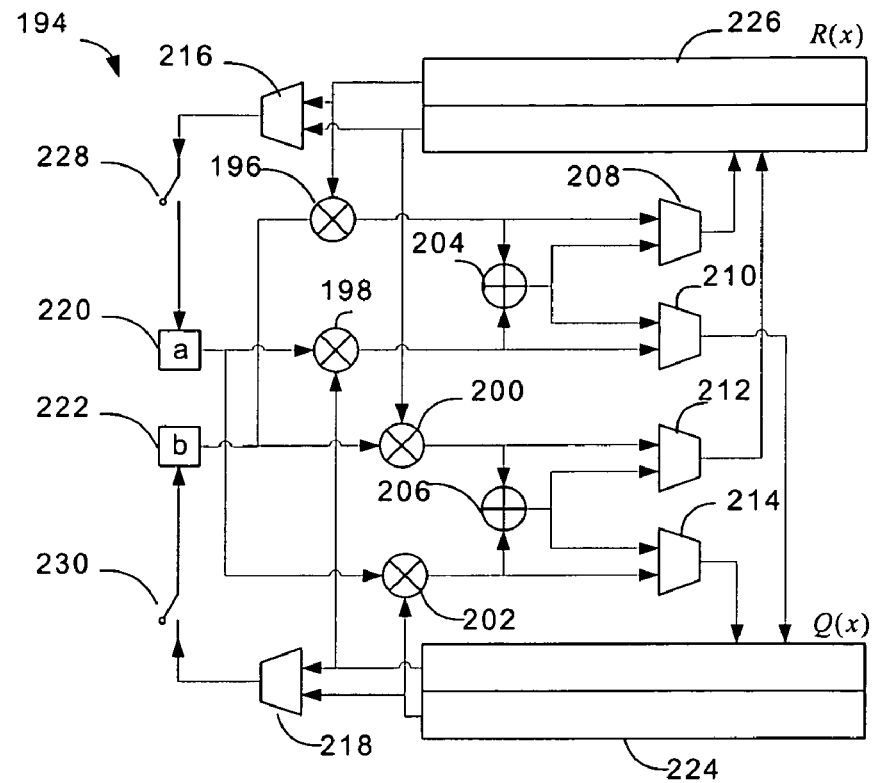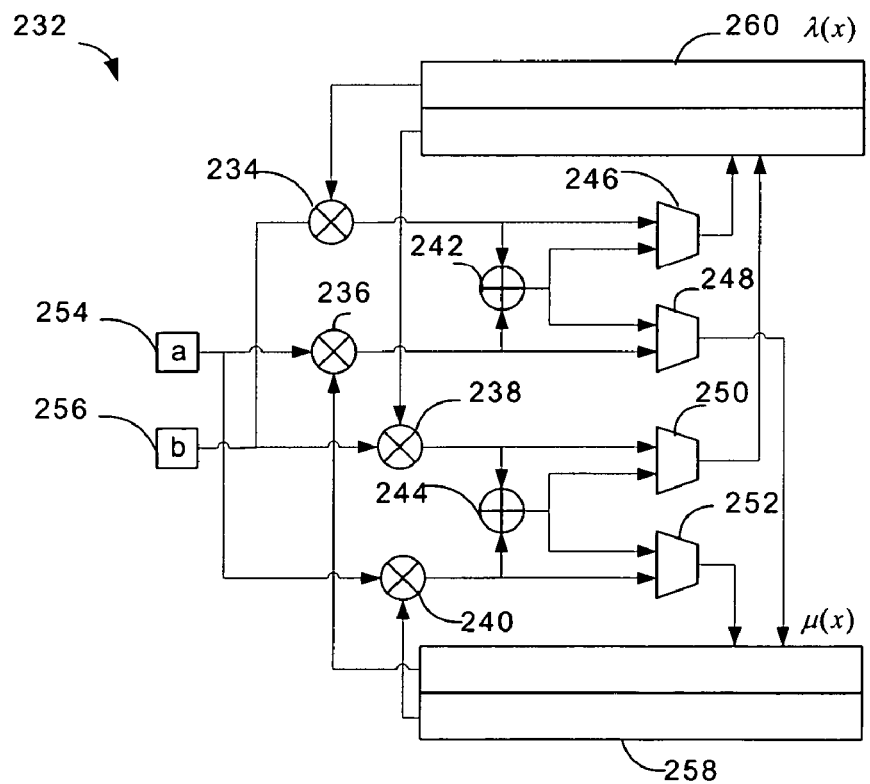
FIG. 11

METHOD AND APPARATUS FOR PROCESSING MULTIPLE DECOMPOSED DATA FOR CALCULATING KEY EQUATION POLYNOMIALS IN DECODING ERROR CORRECTION CODE

BACKGROUND OF THE INVENTION

1. Field of the Invention

The present invention is related to the calculating method of a type of key equation polynomials which is applied in the decoding process of an error correction code, and the corresponding key equation polynomial generator. The key equation polynomials especially comprise an errata locator polynomial and an errata evaluator polynomial.

2. Description of the Prior Art

In the present era of the world of computer networks, people always transfer data by the computer and the internet in their lives or jobs. However, errors in data transferring will unavoidably arise after the data has been transferred from the transmitting location to the destination through a variety of different mediums. The error can be caused by the noise from the transferring paths and (or) transfer medium itself. Therefore, the transferred data will be different from the received data. There is a lot of methods and techniques being developed to detect and correct the received data. Among these, one of the methods is to generate a codeword for the signal part (transferred data) and the parity part (the message to implement the error correction). In this paper, codeword is obtained from encoding the original data, the codeword is the message contained N signals, wherein the signal part is represented by K signals, and the parity part is represented by N–K signals.

As in well-known error correction codes, the BCH (Bose-Chaudhuri-Hocquenghen Codes) and the RS (Reed-Solomon Codes) are the most commonly used Block Codes. The theorems of the BCH Codes and the RS Codes are described in detail in E. R. Berlekamp, *Algoebraic Coding Theory*, McGraw-Hill, New York, 1968 and S. Lin and D. J. Costello, *Error Control Coding: Fundamentals and Applications*, Prentice-Hall, Englewood Cliffs, N.J., 1983 respectively.

A (N, K) BCH, or RS Code contains K message signals and N encoded signals, wherein the signals of the BCH Codes belong to the collection of GF (q), and the signals of the RS Codes belong to the collection of GF (qm). A binary (N, K) BCH Code is capable of correcting t error signals under the condition of $N=2^m-1$ and $N-K \leq mt$. However, a (N, K) RS Code is capable of correcting t error signals and p erasure signals under the condition of $t=\lfloor(N-K-\rho)/2\rfloor$. For the binary BCH Codes, an error signal can be corrected easily by discovering the position of the error signal. For the RS Codes, an error signal can be corrected by discovering the position and error value of the error signal. Furthermore, the definition of an erasure signal in the RS Codes is an error with the known error position; in other words, an error signal can be corrected by discovering the error value.

Referring to FIG. 1, FIG. 1 is the flowchart of decoding architecture of the RS decoder. If the error signal is going to be corrected by using the normal architecture of RS decoder, then the method is summarized into four steps as below in FIG. 1A: (1) calculate the Syndrome 10 by the received codeword, (2) calculate the error locator polynomial and error evaluator polynomial 12, (3) calculate the position of the error 14, and (4) calculate the error value 16. If both the error and the erasure signal are going to be corrected, then the above mentioned four steps are amended as below in FIG. 1B: (1) calculate the Forney Syndrome 18 by the received codeword and erasure position, (2) calculate the errata locator polynomial and errata evaluator polynomial 20, (3) calculate the position 22 of the error, and (4) calculate the correct value 24 of the error and erasure value. The steps in FIG. 1C are: (1) calculate the Syndrome 26 by the received codeword, and calculate the erasure polynomial 28 by the erasure position, (2) calculate the errata locator polynomial and errata evaluator polynomial 30, (3) calculate the position 32 of the error, and (4) calculate the correct value 34 of the error and erasure value.

In the prior art, the key equation polynomial calculation method is referred to the U.S. Pat. No. 6,119,262 which implements the Inverseless Berlekamp-Massey algorithm, and the U.S. Pat. No. 6,286,123 which implements the Berlekamp-Massey algorithm; the U.S. Pat. No. 5,889,793 which implements the Euclidean Algorithm. The above mentioned prior art usually updates only one coefficient or one decomposed data of the coefficient calculation in one single clock cycle. The systems in the prior art, like an optical reproducing system, reads and transmits data in slower speed, yet there will not be problem or delay when the speed of the decoding of data is not required to be too fast. However, the speed of systems has been continuously increased, and the speed of reading and transmitting of data has been greatly increased also. To accommodate such transmitting speed, the prior art usually increases the clock cycle frequency of data decoding, so as to complete decoding within the required time. However, this method of increasing clock cycle frequency to solve the problem also requires a great deal of increase in system power consumption. Therefore, this is not an acceptable solution for those who cannot afford such increase in system power consumption.

SUMMARY OF THE INVENTION

The present invention provides the calculation method and the apparatus of a key equation polynomial which comprises an errata locator polynomial and an errata evaluator polynomial. The errata locator polynomial decomposes into a plurality of coefficient calculations, wherein some of the coefficients or all of them are generated by adding up a plurality of decomposed data. The calculation method comprises a coefficient calculation procedure of the errata locator polynomial, in which the method updates at least two coefficients, or at least two decomposed data, or a combination of the above of the coefficient calculation procedure of the errata locator polynomial in a single clock cycle, so as to obtain the errata locator polynomial. The errata evaluator polynomial can also be decomposed into a plurality of coefficient calculations, wherein some of the coefficients or all of them are generated by adding up a plurality of decomposed data. The calculation method comprises a coefficient calculation procedure of the errata evaluator polynomial, in which the method updates at least two coefficients, or at least two decomposed data, or a combination of the above of the coefficient calculation procedure of the errata evaluator polynomial in a single clock cycle, so as to obtain the errata evaluator polynomial.

BRIEF DESCRIPTION OF THE APPENDED DRAWINGS

FIG. 11 is the errata locator polynomial generating circuit and errata evaluator polynomial generating circuit that are according to the Euclidean Algorithm of a preferred embodiment of the present invention.

DETAILED DESCRIPTION OF THE INVENTION

Figure 1:
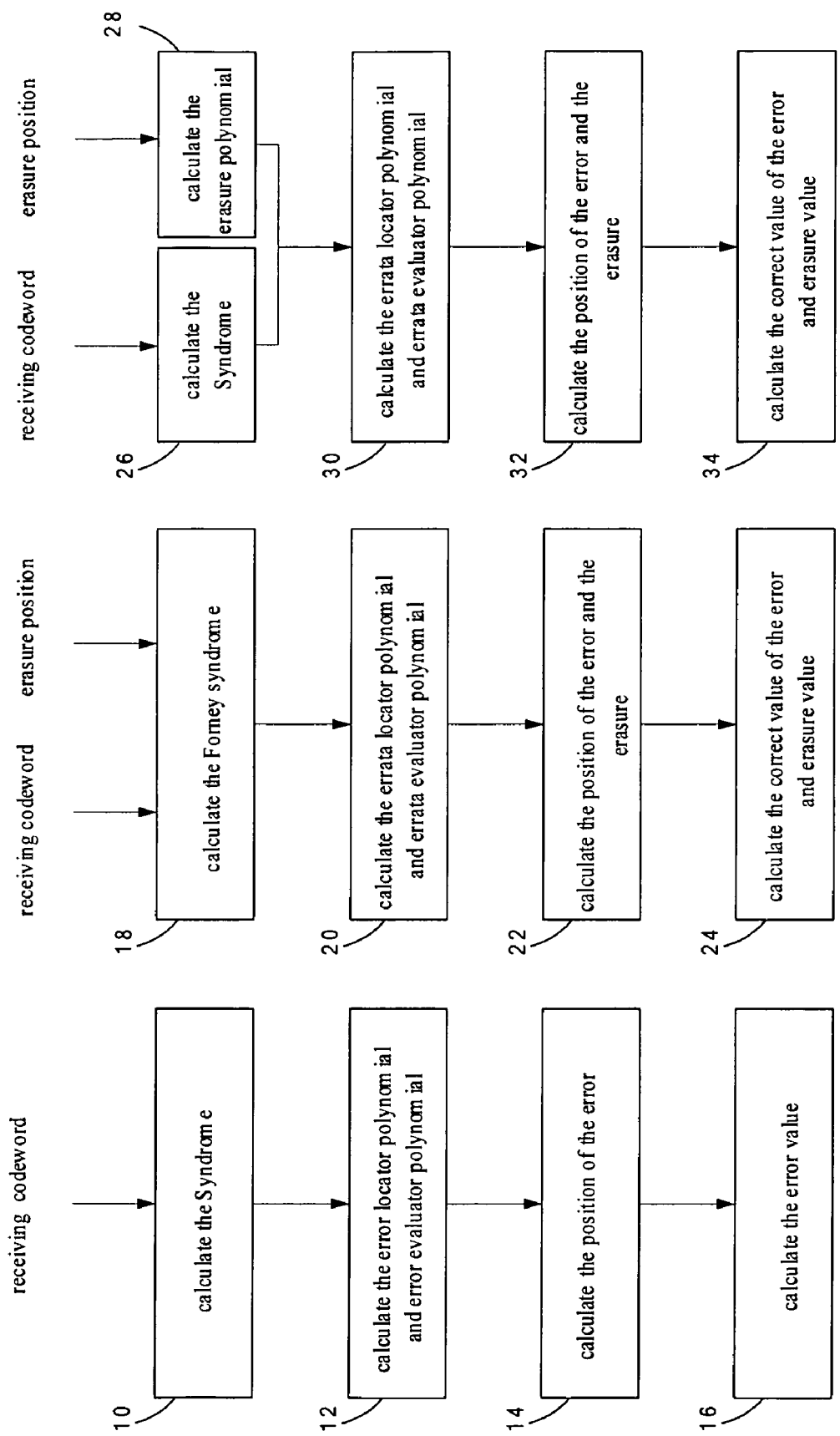
FIG. 1 is the flowchart of the decoding architecture of the RS decoder.
Figure 2:
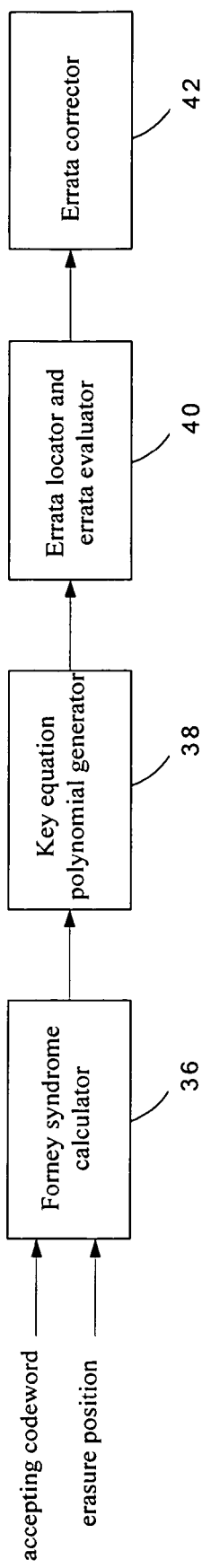
FIG. 2 is the flowchart of the method for decoding the error correction code in the present invention.

Referring to FIG. 2, FIG. 2 is a flowchart of the method for decoding the error correction code of the present the invention. FIG. 2 shows the main procedure and apparatus of method for decoding error correction code of the invention; the decoding error correction code system of the invention comprises a Forney syndrome calculator 36, a key equation polynomial generator 38, an errata locator and errata evaluator 40, and an errata corrector 42. A Forney syndrome calculator 36 calculates the corresponding Forney syndrome polynomial by the received code and erasure location. The Key equation polynomial generator 38 receives the Forney syndrome polynomial; the Forney syndrome polynomial is calculated from the Forney syndrome calculator 36 and by using a calculating method for a key equation polynomial to get an errata locator polynomial and an errata evaluator polynomial. The error location and the corresponding error value can be found by inputting the errata locator polynomial and the errata evaluator polynomial to error location and error value calculator 40. Then, errata corrector 42 corrects the found error location and the corresponding error value.

Figure 3:
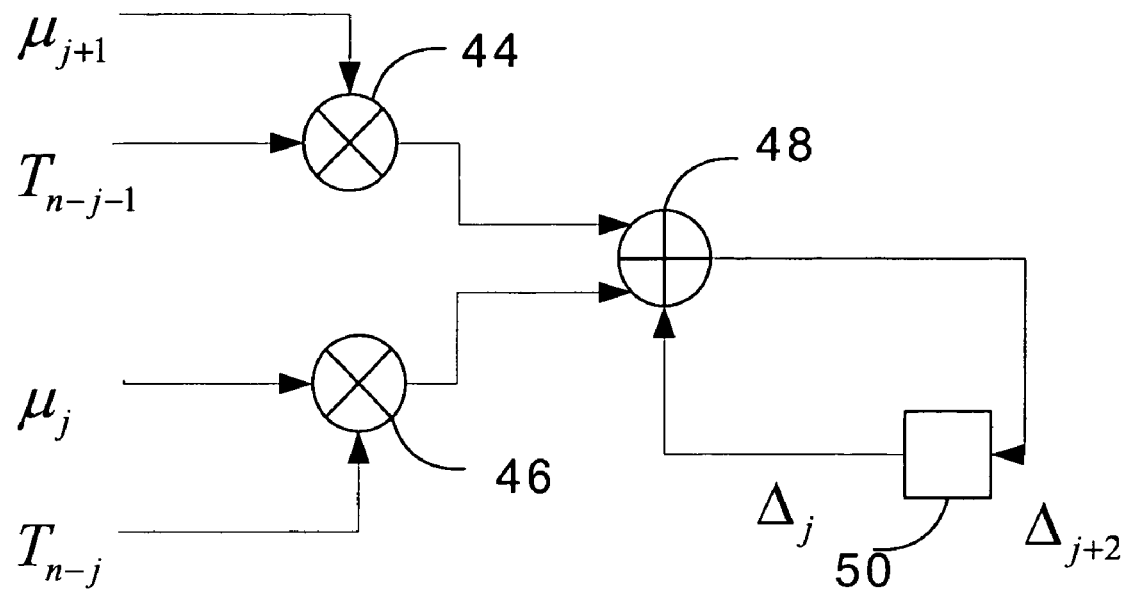
FIG. 3 is the schematic diagram of calculating two decomposed data in a single clock cycle of the present invention.

Referring to FIG. 3, FIG. 3 is a schematic diagram of calculating two decomposed data in a single clock cycle of the present invention. All algorithms of getting the key equation are composed by calculations of three polynomials as below:

The first polynomial calculating method:

$$\Delta = \sum_{j=0}^{m} \mu_j T_{n-j} \quad (1)$$

$$= \mu_m T_{n-m} + \mu_{m-1} T_{n-m+1} + \ldots + \mu_2 T_{n-2} + \mu_1 T_{n-1} + \mu_0 T_n$$

Wherein $\mu_m$ is m order coefficient of $\mu(x)$, $T_n$ is n order coefficient of $T(x)$, and $\Delta$ is the coefficient calculating result of two polynomials: $\mu(x)$ and $T(x)$; equation (1) is rewritten as below:
for j=0 to m; j=j+2

$$\Delta_{j+2} = \Delta_j + \mu_{j+1} T_{n-j-1} + \mu_j T_{n-j}$$

end

This equation calculates two decomposed data in a single clock cycle, so the value of $\Delta$ can be calculated in half of the original cycle. FIG. 3 is a schematic diagram of calculating two decomposed data in a single clock cycle.

The second polynomial calculating method:

$$\omega(x) = S(x)\sigma(x) \quad (2)$$

$$= (S_0 \sigma_0) + (S_1 \sigma_0 + S_0 \sigma_1)x +$$

$$(S_2 \sigma_0 + S_1 \sigma_1 + S_0 \sigma_2)x^2 + \ldots$$

Polynomial $\omega(x)$ is the multiplication of polynomial $S(x)$ and polynomial $\sigma(x)$. The calculation of the polynomial $\omega(x)$ can compute at least two decomposed data, which are within the coefficient of an order, (as in the calculating method of (1)) or calculate at least two order coefficients of the polynomial $\omega(x)$ simultaneously, or a combination of the above. Thus, polynomial $\omega(x)$ can be calculated in less calculating cycles.

The third polynomial calculating method:

$$Y(x) = aP(x) + bQ(x)x^k \quad (3)$$

Figure 4:
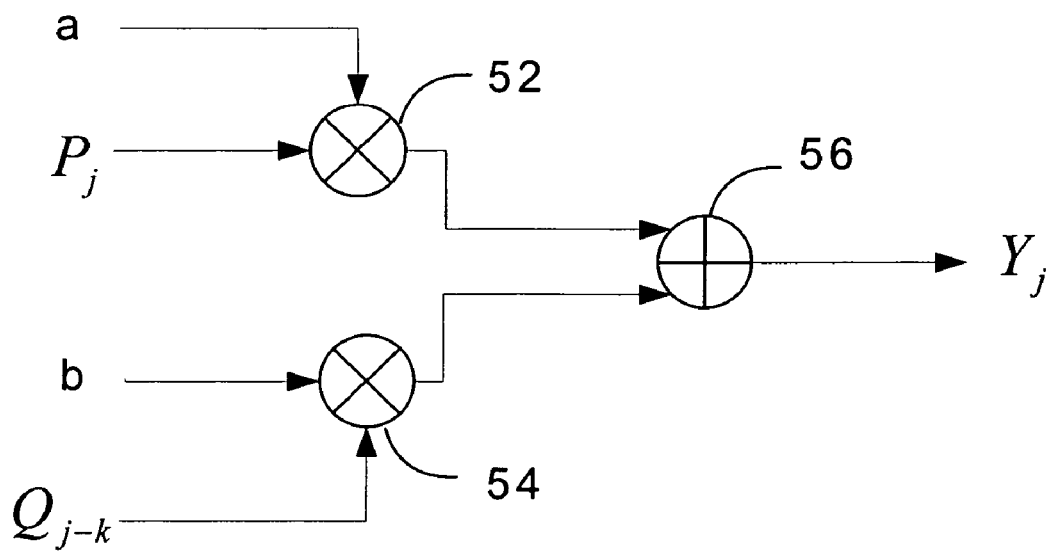
FIG. 4 is a schematic diagram of calculating at least two order coefficients in a single clock cycle of the present invention.

The polynomial $Y(x)$ is formed by adding the polynomial $P(x)$, which is further multiplied by finite field constant a, and polynomial $Q(x)$, which is further multiplied by finite field constants b and $x^k$. The j order coefficient of polynomial $Y(x)$ is $Y_j = aP_j + bQ_{j-k}$; thus, the results can be calculated in less calculating cycles whenever at least two order coefficients are calculated in a single clock. Referring to FIG. 4, FIG. 4 is a schematic diagram of calculating at least two order coefficients in a single clock cycle of the present invention.

Thus, by using the present three polynomial calculating methods for obtaining the key equation in a clock cycle to calculate at least two of the coefficients, or at least two of the decomposed data, or the combination of above, the present algorithm reduces much of the calculating cycles in dealing with limited circuits to obtain the key equation.

With the spirits of the present invention, the present calculating method for the key equation polynomial can further be implemented by circuit designs with the references of the prior art. The following examples are the preferred algorithms which are combined with the corresponding circuit implemented by the spirit of the present invention to obtain the errata locator polynomial and the errata evaluator polynomial: the Inverseless Berlekamp-Massey algorithm, the Berlekamp-Massey algorithm, and the Modified Euclidean algorithm. Thus, the following circuits will be introduced: the circuits generated by the Inverseless Belekamp-Massey algorithm with the errata locator polynomial and the errata evaluator polynomial; the circuits generated by the Belekamp-Massey algorithm with the errata locator polynomial and the errata evaluator polynomial; and the circuits generated by the Euclidean algorithm with the errata locator polynomial and the errata evaluator polynomial.

1. The First Preferred Embodiment

The Inverseless Berlekamp-Massey Algorithm

Figure 5:
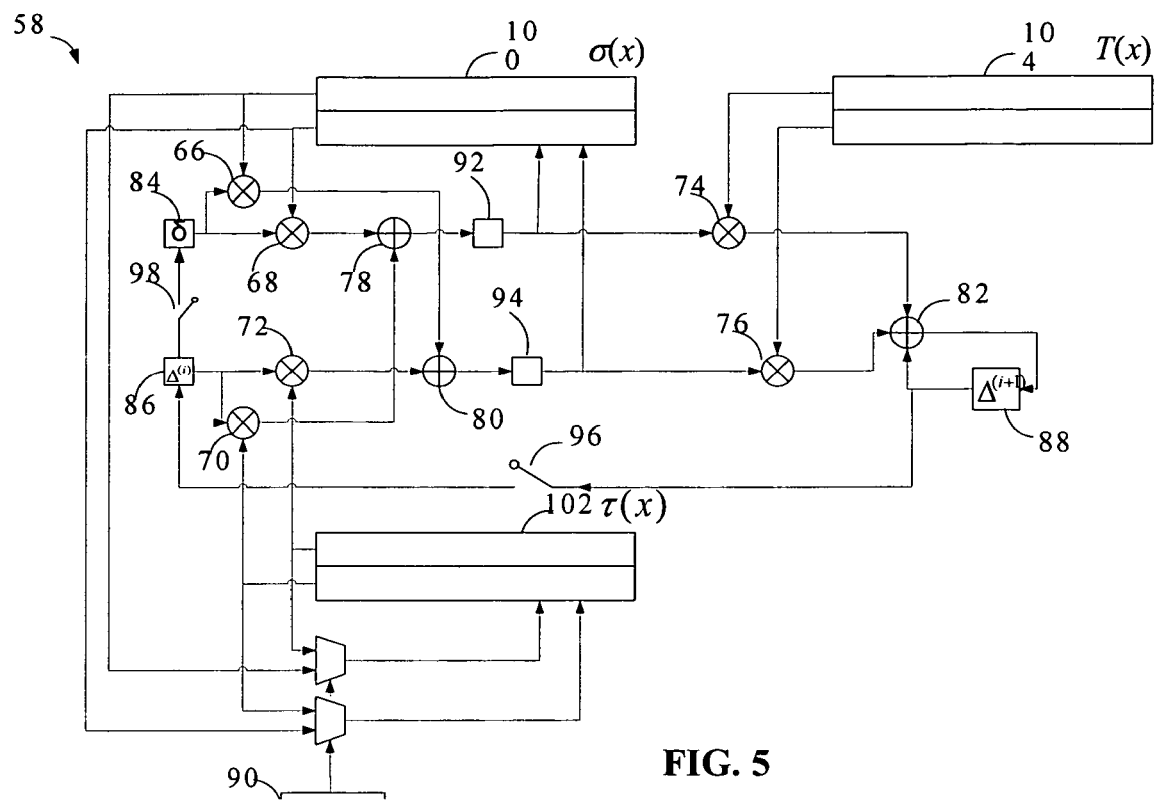
FIG. 5 is the implementation of the errata locator polynomial generating circuit, which is based on the Inverseless Berlekamp-Massey algorithm, of the present invention.

Referring to FIG. 5, FIG. 5 is the implementation of the errata locator polynomial generating circuit, which is based on the Inverseless Berlekamp-Massey algorithm, of the present invention. The traditional Inverseless Berlekamp-Massey algorithm which calculates one coefficient in a single clock cycle is presented as below:

```
D^(ρ-1) = 0
δ = 1
σ^(ρ-1)(x) = τ^(ρ-1)(x) = Λ(x)
Δ^(ρ) = T_{ρ+1}Λ_0 + T_ρΛ_1 + ... + T_1Λ_ρ
for i = ρ to N - K - 1 begin
    Δ_0^(i+1) = 0, Δ_{-1}^(i+1) = 0, τ_{-1}^(i-1) = 0
    for j = 0 to j ≦ v_i + ρ; j = j + 1 begin
        σ_j^(i) = δσ_j^(i-1) - Δ^(i)τ_{j-1}^(i-1)
        Δ_j^(i+1) = Δ_{j-1}^(i+1) + T_{i-j+3}σ_{j-1}^(i)
    end loop
    if Δ^(i) = 0 or 2D^(i-1) ≧ i + 1
        D^(i) = D^(i-1)
        τ^(i)(x) = xτ^(i-1)(x)
    else
        D^(i) = i + 1 - D^(i-1)
        δ = Δ^(i)
        τ^(i)(x) = σ^(i-1)(x)
end loop
σ(x) = σ_0^(N-K-1) + σ_1^(N-K-1)x + ... + σ_{v+ρ}^(N-K-1)x^{v+ρ}
``` wherein ρ is the number of erasures in the range of $0 \leq \rho \leq N-K$;

$$\Lambda(x) = \prod_{\alpha^i \in \Lambda} (1 + \alpha^i x)$$

and Λ is the erasure set; Tj's are the coefficients of the Forney syndrome polynomial, where T(x)=Λ(x)S(x) mod xN-K; σ(i)(x) is the i-th step errata locator polynomial with degree vi+ρ; σj(i) is the coefficient of the polynomial σ(x); Δ(i) is the i-th step discrepancy, and δ is a previously generated discrepancy; τ(i)(x) is an auxiliary polynomial, and D(i) is an auxiliary degree variable. Here, the algorithm provides for the correction of errors and erasures. If there are no erasures, then ρ=0, T(x)=S(x), and σ-1(x)=τ-1(x)=1. Then, the algorithm can be reduced to a simpler form, which can be further referred to the description of U.S. Pat. No. 6,119,262.

The preferred embodiment of errata locator polynomial, which is according to the Inverseless Berlekamp-Massey algorithm, calculates two coefficients or two decomposed data in a single clock cycle, and the Inverseless Berlekamp-Massey algorithm is presented as below:

```
D^(ρ-1) = 0
δ = 1
σ^(ρ-1)(x) = τ^(ρ-1)(x) = Λ(x)
Δ^(ρ) = T_{ρ+1}Λ_0 + T_ρΛ_1 + ... + T_1Λ_ρ
for i = ρ to N - K - 1 begin
    Δ_0^(i+1) = 0, Δ_{-2}^(i+1) = 0, τ_{-1}^(i-1) = 0,
    for j = 0 to j ≦ v_i + ρ; j = j + 2 begin
        σ_j^(i) = δσ_j^(i-1) - Δ^(i)τ_{j-1}^(i-1)
        σ_{j+1}^(i) = δσ_{j+1}^(i-1) - Δ^(i)τ_j^(i-1)
        Δ_j^(i+1) = Δ_{j-2}^(i+1) + T_{i-j+2}σ_j^(i) + T_{i-j+3}σ_{j-1}^(i)
    end loop
    if Δ^(i) = 0 or 2D^(i-1) ≧ i + 1
        D^(i) = D^(i-1)
        τ^(i)(x) = xτ^(i-1)(x)
    else
        D^(i) = i + 1 - D^(i-1)
        δ = Δ^(i)
        τ^(i)(x) = σ^(i-1)(x)
end loop
σ(x) = σ_0^(N-K-1) + σ_1^(N-K-1)x + ... + σ_{v+ρ}^(N-K-1)x^{v+ρ}
``` wherein the corresponding definition of variables and parameters are the same as the previous definitions.

Figure 6:
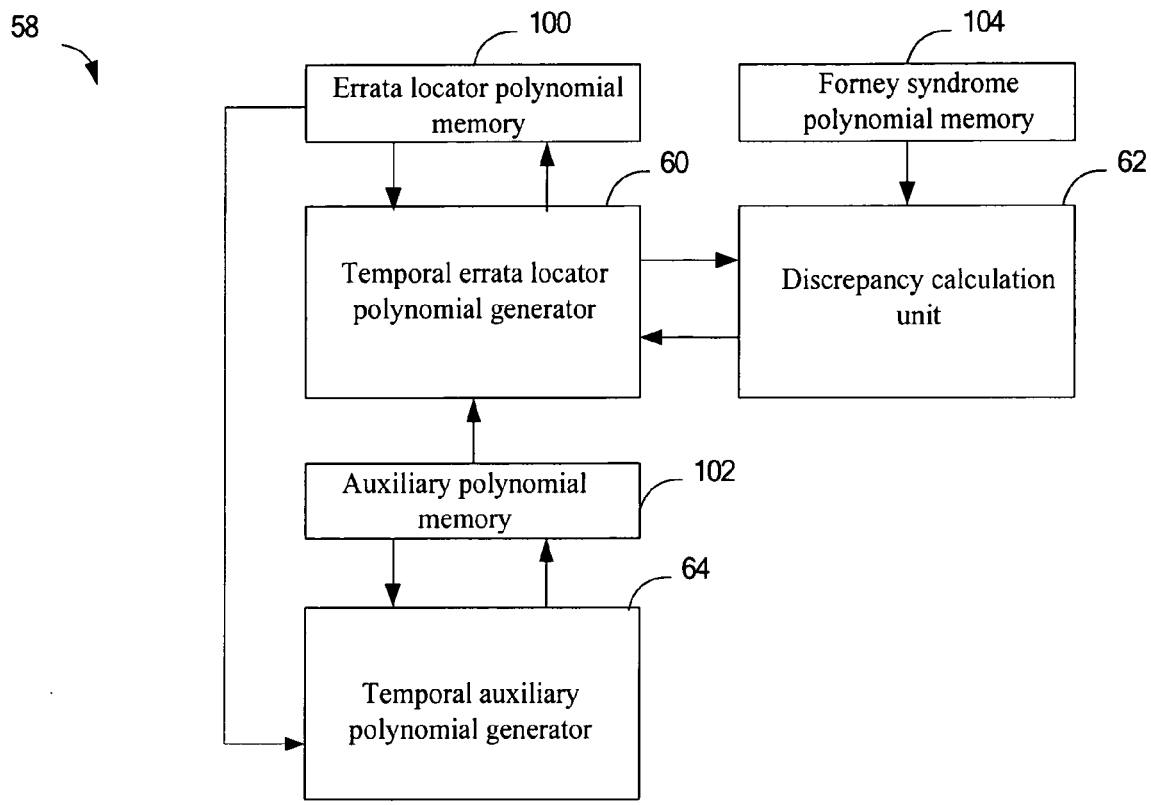
FIG. 6 is the schematic unit diagram of the errata locator polynomial generator in FIG. 5.

Referring to FIG. 6, FIG. 6 is the schematic unit diagram of the errata locator polynomial generator 58 in FIG. 5. A preferred embodiment of the present invention, the errata locator polynomial generator 58, comprises a temporal errata locator polynomial 60, a discrepancy calculation unit 62, and a temporal auxiliary polynomial generator 64.

The temporal errata locator polynomial 60 reads the coefficient of a temporal errata locator polynomial and the coefficient of a temporal auxiliary polynomial, and it executes the coefficients calculation of a temporal errata locator polynomial.

The discrepancy calculation unit 62 reads the coefficient of a temporal errata locator polynomial and the coefficient of a Forney syndrome polynomial, and then it executes the calculation of a discrepancy.

The temporal auxiliary polynomial generator 64 reads the coefficient of a temporal errata locator polynomial and the coefficient of a temporal auxiliary polynomial, and then it updates the temporal auxiliary polynomial.

Referring to FIG. 5 and FIG. 6, the errata locator polynomial generator 58, which is the preferred embodiment of the present invention, comprises a first multiplier 66, a second multiplier 68, a third multiplier 70, a fourth multiplier 72, a fifth multiplier 74, a sixth multiplier 76, a first adder 78, a second adder 80, a third adder 82, a first discrepancy register 84, a second discrepancy register 86, a third discrepancy register 88, an auxiliary determinator 90, a first register 92, a second register 94, a first switch 96, and a second switch 98, to calculate each of the coefficients of the errata locator polynomial. Each of the coefficients of the errata locator polynomial is added up from a plurality of decomposed data. The errata locator polynomial generator 58 of the preferred embodiment also comprises an errata locator polynomial memory 100 which stores the errata locator polynomial, an auxiliary memory 102 which stores the auxiliary polynomial, and a Forney syndrome memory 104 which stores the Forney syndrome polynomial.

In the preferred embodiment of the errata locator polynomial generator 58 of the present invention, the method of calculating the coefficient of the temporal errata locator polynomial comprises a first multiplier 66, a fourth multiplier 72, and a second adder 80. The first multiplier 66 accepts a coefficient of the errata locator polynomial memory 100 and the first discrepancy of the first discrepancy register 84, and it then proceeds the multiplication of the two to obtain a first multiplied result; the fourth multiplier 72 accepts a coefficient of an auxiliary polynomial in the auxiliary memory 102 and the second discrepancy in the second discrepancy register 86, and it then proceeds the multiplication of the two to obtain a second multiplied result; the second adder 80 adds up the first multiplied result and the second multiplied result to obtain a coefficient of the temporal errata locator polynomial and to store the coefficient in the second register 94.

The first multiplier 66, the fourth multiplier 72, the second adder 80, and the second register 94 are replaced by the second multiplier 68, the third multiplier 70, the first adder 78, and the first register 92 respectively, and the calculation of another coefficient of the temporal errata locator polynomial in the same single clock cycle is completed.

In other words, in a preferred embodiment of the present invention, the temporal auxiliary polynomial generator 58 completes the calculation of two coefficients of the temporal errata locator polynomial in a single clock cycle.

However, the temporal auxiliary polynomial generator 58 can complete the calculation of more than two coefficients of the temporal errata locator polynomial in a single clock cycle if there are enough multipliers, adders, and registers.

The errata locator polynomial generator 58 updates the auxiliary polynomial in the auxiliary memory 102 by using an auxiliary determinator 90, wherein the auxiliary determinator 90 comprises a determination module which stores an auxiliary degree variable. The determination module, according to the discrepancy in the second discrepancy register 86 and the auxiliary degree variable stored in the auxiliary determinator 90, determines whether the auxiliary polynomial in the auxiliary memory 102 should be replaced by the original auxiliary polynomial which was phase shifted, or replaced by the current temporal errata locator polynomial.

The discrepancy calculation unit 62, which comprises at least two multipliers, an adder 82, and a register 88, calculates each of the coefficients of the errata evaluator polynomial. In a preferred embodiment of the present invention, the discrepancy calculation unit 62 comprises a fifth multiplier 74 and a sixth multiplier 76. The calculation of the discrepancy is done by accepting a coefficient of the Forney syndrome polynomial, which was stored in the Forney syndrome memory 104, and a coefficient of the temporal errata locator polynomial, which was obtained by the calculation of the temporal errata locator polynomial generator 60 respectively by the fifth multiplier 74 and the sixth multiplier 76, and it further proceeds the multiplication of the two to obtain at least two decomposed data. Then, the adder 82 adds up the decomposed data and a registered result, which was last stored in the register 88, to obtain a corresponding added up result; next, the registered result in the register 88 is updated by the newly added-up result. The calculation of the multiplication and the addition mentioned above are completed in a single clock cycle.

Referring to FIG. 6, the temporal errata locator polynomial generator 60 first reads two coefficients of the temporal errata locator polynomial, and two coefficients of the temporal auxiliary polynomial to calculate two coefficients of the temporal errata locator polynomial. Meanwhile, the temporal auxiliary polynomial generator 64 reads a coefficient of the temporal errata locator polynomial in the errata locator polynomial memory 100, and it also reads a coefficient of the temporal auxiliary polynomial in the auxiliary memory 102 to update the temporal auxiliary polynomial.

Then, the discrepancy calculation unit 62 reads the two coefficients of the temporal errata locator polynomial which are output from the temporal errata locator polynomial generator 60, and it also reads the two coefficients of the Forney syndrome polynomial which are output from the Forney syndrome polynomial memory 104 to calculate a discrepancy.

Figure 7:
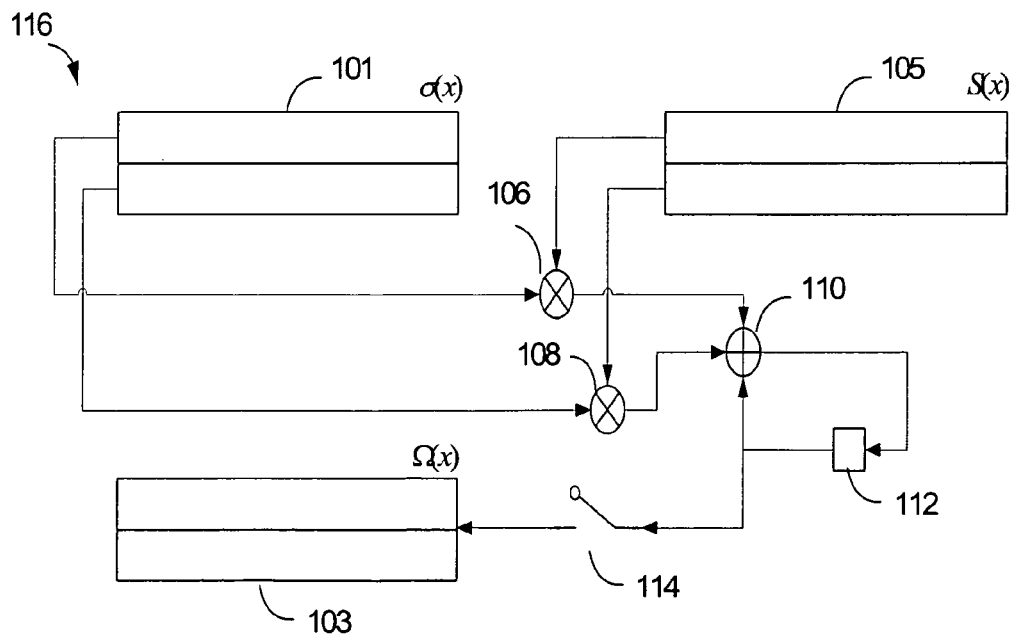
FIG. 7 is the design of the errata evaluator polynomial generating circuit, which is based on the Inverseless Berlekamp-Massey algorithm, of the present invention.

Referring to FIG. 7, FIG. 7 is the design of the errata evaluator polynomial generating circuit 116, which is based on the Inverseless Berlekamp-Massey algorithm, of the present invention. Here, the errata evaluator polynomial of the present invention is obtained according to the calculation as below:

$$\Omega(x) = S(x)\sigma(x) \bmod x^{N-K}$$

wherein $S(x)$ is the syndrome polynomial, and $\sigma(x)$ is errata locator polynomial.

In other words, the errata evaluator polynomial is obtained successfully by the remainder of the multiplication of the syndrome polynomial and the previously obtained errata locator polynomial, wherein each of the coefficients of the errata evaluator polynomial is added up from a plurality of decomposed data (same as equation 2). There is also a lot of variability in the case of multiplication and addition calculation which were used in the process of generating the coefficients; the main combinations are algorithm (A), algorithm (B), and the combination of algorithm (A) and algorithm (B). The algorithm (A) calculates at least two decomposed data of a coefficient in a calculation, until the coefficient being calculated currently is obtained successfully and is further stored into the errata evaluator polynomial memory, then the next coefficient calculation will be continued. The algorithm (B) calculates the decomposed data of at least two different coefficients; when the two different coefficients are obtained successfully, then the two different coefficients are stored into the errata evaluator polynomial memory respectively. Then, the calculation of the next two coefficients will continue.

Thus, the errata evaluator polynomial generating circuit of the present invention, according to the two slightly different algorithms, can generate two different circuit implementations. For the examples of calculating two coefficients or two decomposed data in a single clock cycle, the two types of algorithms (A) and (B) are presented as below:

(A). Calculate at least two decomposed data of a coefficient in one calculation for $i=0$; $i \leq v+\rho-1$; $i=i+1$ begin $$\Omega_i^{(-2)} = 0$$

for $j=0$; $j \leq i$; $j=j+2$ begin $$\Omega_i^{(j)} = \Omega_i^{(j-2)} + S_{i-j+1} + S_{i-j}\sigma_{j+1}$$

end loop
end loop wherein $\Omega i(j)$ is the jth calculation of the ith order coefficient of the errata evaluator polynomial, $S_{i-j}$ is the $(i-j)$th order coefficient of the syndrome polynomial, and $\sigma j$ is the jth order coefficient of the errata locator polynomial.

(B). Calculate the decomposed data of two different coefficients in one calculation.

for $i=0$; $i \leq v+\rho-1$; $i=i+2$ begin $$\Omega_i^{(-1)} = 0$$

$$\Omega_{i+1}^{(-1)} = 0$$

for $j=0$; $j \leq i$; $j=j+1$ begin $$\Omega_i^{(j)} = \Omega_i^{(j-1)} + S_{i-j+1}\sigma_j$$

$$\Omega_{i+1}^{(j)} = \Omega_{i+1}^{(j-1)} + S_{i+1-j+1}\sigma_j$$

end loop
end loop

According to the algorithm (A), the errata evaluator polynomial of the preferred embodiment completes a calculation of a coefficient, and stores the coefficient into the errata evaluator polynomial memory; then, the next coefficient calculation will continue. The process will repeat the calculation until the coefficients of all order of the errata evaluator polynomial are obtained.

The errata evaluator polynomial generating circuit 116 of the preferred embodiment calculates each of the coefficients of the errata evaluator polynomial by using a first multiplier 106, a second multiplier 108, an adder 110, a syndrome polynomial memory 105, an errata locator polynomial memory 101, an errata evaluator polynomial memory 103, and a register 112. The first multiplier 106 and the second multiplier 108, according to the calculating procedure of the coefficients of the errata evaluator polynomial, accepts a coefficient of the syndrome polynomial which is stored in the syndrome polynomial memory 105 and a coefficient in the errata locator polynomial memory 100; then, it calculates their multiplication to obtain a first decomposed data and a second decomposed data. Then, the adder 110 adds up the first decomposed data, the second decomposed data, and the result last stored in the register 112 to obtain a corresponding added-up result, and then it updates the result in the register 112 to the newly obtained result. The calculating of the multiplication and the addition mentioned above are completed in a single clock cycle. When the coefficients of the errata evaluator polynomial are being calculated, the switch 114 is turned on and stores the results in the errata evaluator polynomial memory 103. At the same time, the register 112 is being cleaned up to prepare for the calculation of the next coefficient of the errata evaluator polynomial.

Figure 8:
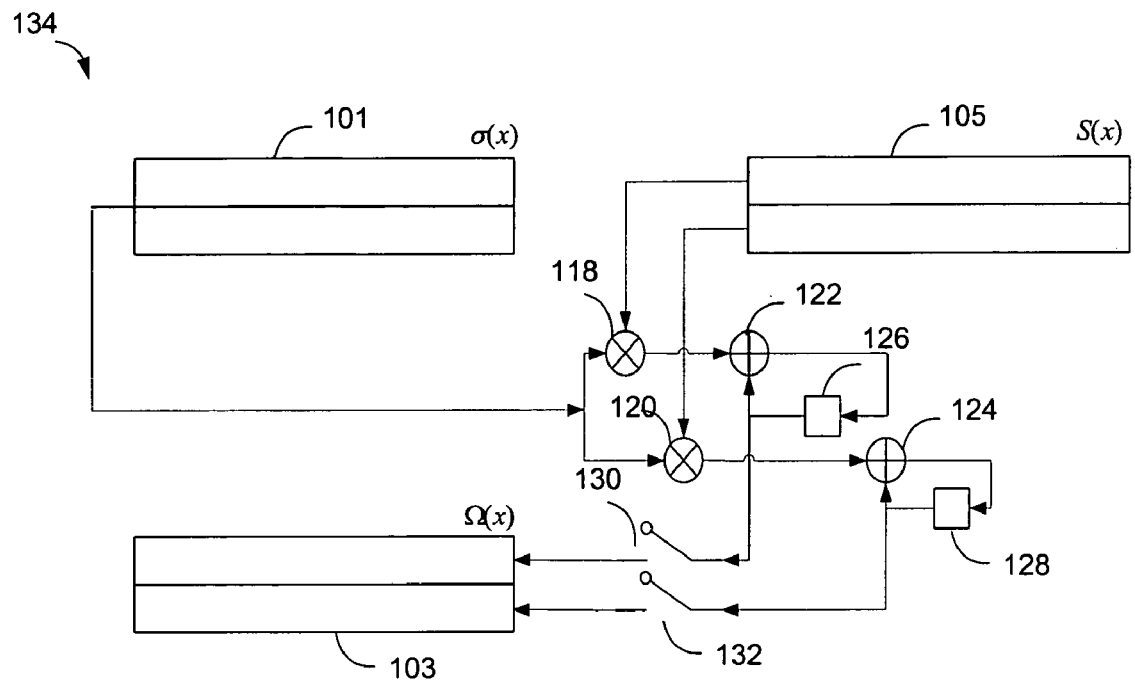
FIG. 8 is another errata evaluator polynomial generating circuit, which is designed in accordance with the Inverseless Berlekamp-Massey algorithm, of the present invention.

FIG. 8 is the other errata evaluator polynomial generating circuit 134, which is designed in accordance with the Inverseless Berlekamp-Massey algorithm of the present invention. In accordance with the algorithm (B), the errata evaluator polynomial of the preferred embodiment calculates the multiple coefficients of the errata evaluator polynomial simultaneously, and then it stores each of the calculated coefficients of the errata evaluator polynomial into the errata evaluator polynomial memory respectively. The procedure is being repeated until the coefficients of all orders of the errata evaluator polynomial are calculated.

The errata evaluator polynomial generating circuit 134 of the preferred embodiment calculates two of the coefficients of the errata evaluator polynomial of the errata evaluator polynomial generating circuit 134 by using a first multiplier 118, a second multiplier 120, a first adder 122, a second adder 124, a first register 126, a second register 128, an errata locator polynomial memory 101, a syndrome polynomial memory 105, and an errata evaluator polynomial 103. The first multiplier 118 and the second multiplier 120, according to the calculating procedure of the coefficients of the errata evaluator polynomial accepts a coefficient of the syndrome polynomial which was stored in the syndrome polynomial memory 105 and a coefficient of the errata locator polynomial in the errata locator polynomial memory 101; it then calculates their multiplication to obtain a first decomposed data and a second decomposed data. Then, the first adder adds up the first decomposed data and the first registered result which is last stored in the first register 126 to obtain a corresponding first added-up result, and then it updates the first registered result in the first register 126 to the newly obtained first added-up result. At the same time, the second adder 124 adds up the second decomposed data and the second registered result which is last stored in the second register 128 to obtain a corresponding second added-up result, and it then updates the second registered result in the second register 128 to the newly obtained second added-up result. The calculating of the multiplication and the addition mentioned above are completed in a single clock cycle. When the coefficients of the errata evaluator polynomial are being calculated, the switch 130 or the switch 132 is turned on and stores the results in the errata evaluator polynomial memory 103. When the two results are stored in the errata evaluator polynomial memory 103, the register 126 and the register 128 are being cleaned up at the same time to prepare for the calculation of the next two coefficients of the errata evaluator polynomial.

2. The Second Preferred Embodiment

The Inverse Berlekamp-Massey Algorithm

Figure 9:
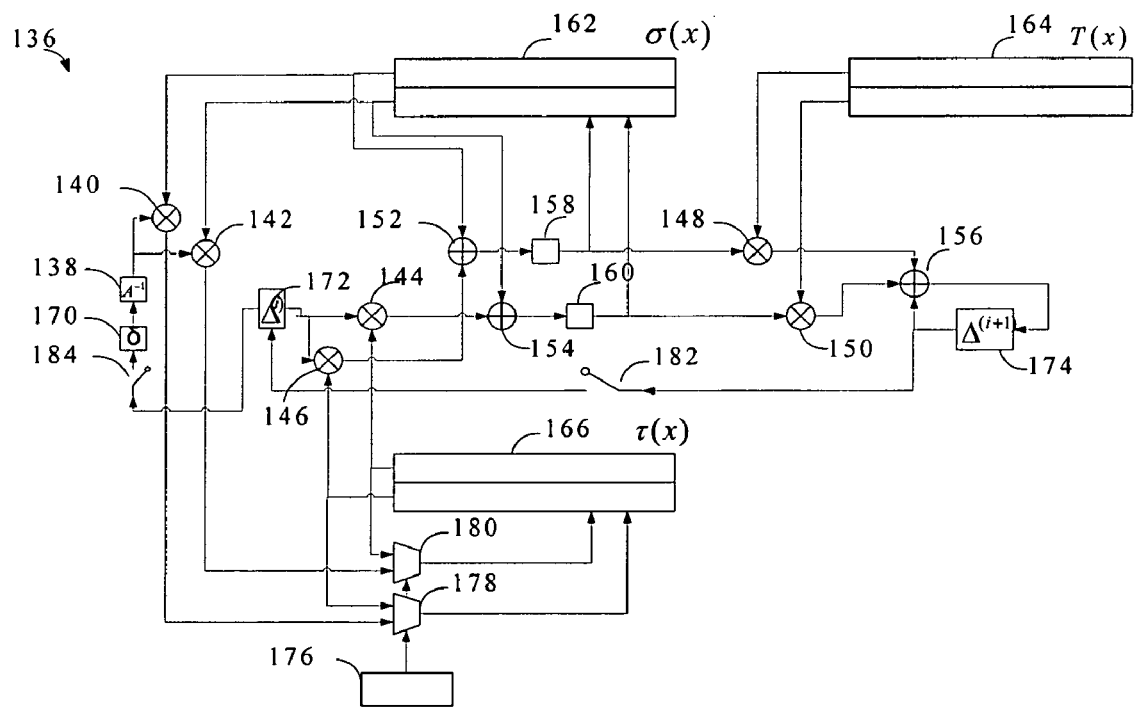
FIG. 9 is the errata locator polynomial generating circuit, which is based on an Inverse Berlekamp-Massey algorithm, of the embodiment of the present invention, to calculate the errata locator polynomial.

Referring to FIG. 9, FIG. 9 is the errata locator polynomial generating circuit, which is based on an Inverse Berlekamp-Massey algorithm, of the embodiment of the present invention, to calculate the errata locator polynomial. The errata locator polynomial of the embodiment is obtained by the calculation of the Inverse Berlekamp-Massey algorithm. Because there are some parts alike between the Inverse and the Inverseless Berlekamp-Massey algorithm, the description is not going to be repeated. However, the main difference of the Inverse Berlekamp-Massey algorithm is listed as below:

$$\sigma^{(i)}(x) = \sigma^{(i-1)}(x) + \frac{1}{\delta}\Delta^{(i)}x\tau^{(i-1)}(x)$$
$$= \sigma^{(i-1)}(x) + \Delta^{(i)}\left(\frac{1}{\delta}\tau^{(i-1)}(x)\right)x$$

The coefficient calculating procedure of the errata locator polynomial is an Inverse Berlekamp-Massey algorithm; the errata locator polynomial generating circuit 136 of the second embodiment comprises a reciprocal calculator 138, a first multiplier 140, a second multiplier 142, a third multiplier 144, a fourth multiplier 146, a fifth multiplier 148, a sixth multiplier 150, a first adder 152, a second adder 154, a third adder 156, a first register 158, a second register 160, a first discrepancy register 170, a second discrepancy register 172, a third discrepancy register 174, an errata locator polynomial memory 162, a Forney syndrome polynomial memory 164, and an auxiliary memory 166 to calculate each of the coefficients of the errata locator polynomial which is in the errata locator polynomial memory 162, wherein each of the coefficients of the errata locator polynomial is added up from a plurality of decomposed data.

Figure 10:
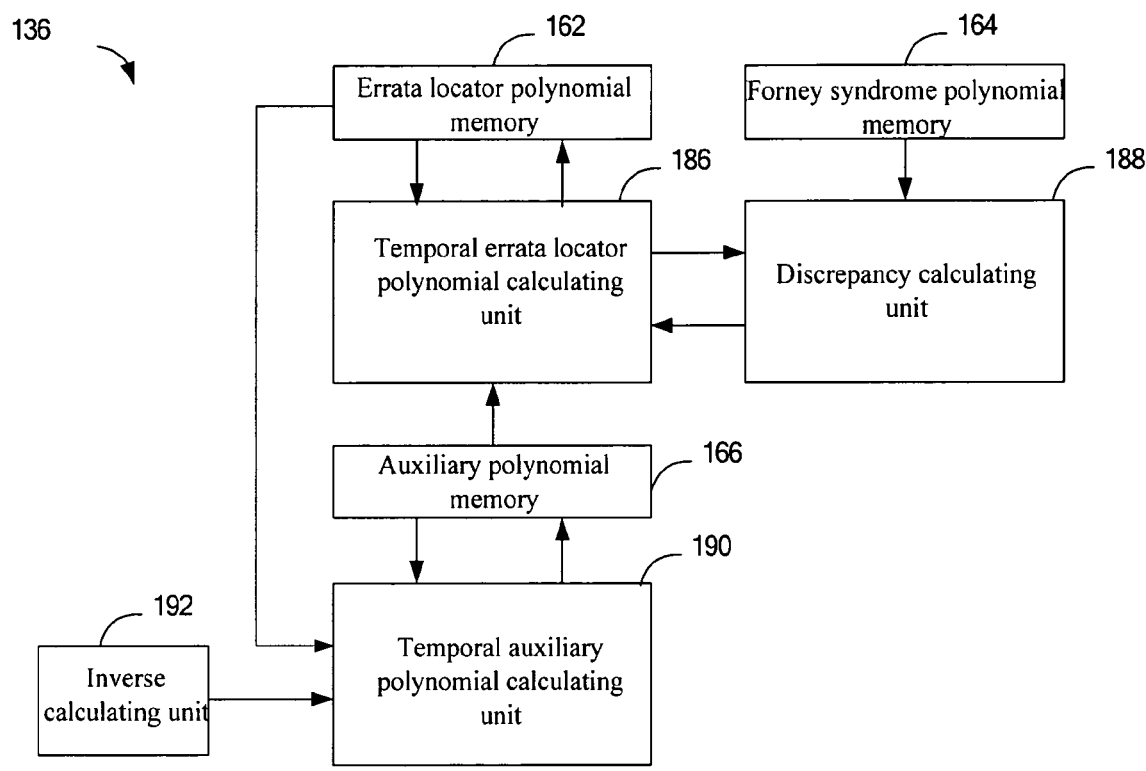
FIG. 10 is the schematic unit diagram of the errata locator polynomial generating circuit in FIG. 9 of the present invention.

Referring to FIG. 10, FIG. 10 is the unit diagram of the errata locator polynomial generating circuit 136 in FIG. 9 of the present invention. The errata locator polynomial generating circuit 136 comprises a temporal errata locator polynomial calculating unit 186, a discrepancy calculating unit 188, a temporal auxiliary polynomial calculating unit 190, and an Inverse calculating unit 192.

The temporal errata locator polynomial calculating unit 186 is for reading the coefficient of the temporal errata locator polynomial which is stored in the errata locator polynomial memory 162, and for reading the coefficient of the temporal auxiliary polynomial to execute the coefficient calculation of a temporal errata locator polynomial.

The discrepancy calculating unit 188 is for reading the coefficient of the temporal errata locator polynomial and the coefficient of the Forney syndrome polynomial which is stored in the Forney syndrome polynomial memory 164 to execute the calculation of a discrepancy.

The temporal auxiliary polynomial calculating unit 190 is for reading the coefficient of the temporal errata locator polynomial which is stored in the errata locator polynomial memory 162, and for reading the coefficient of the temporal auxiliary polynomial to update the temporal auxiliary polynomial.

The Inverse calculating unit 192 is for reading a discrepancy to obtain the reciprocal of the value. In the second embodiment of the present invention, the Inverse calculating unit 192 comprises a first discrepancy register 170 and a reciprocal calculator 138. The reciprocal calculator 138 accepts the first discrepancy which is in the first discrepancy register 170 to generate the reciprocal of the first discrepancy.

In the errata locator polynomial generating circuit 136 of the embodiment of the present invention, the coefficient calculating method of the temporal errata locator polynomial uses a fourth multiplier 146 and a first adder 152, wherein the fourth multiplier 146 accepts a coefficient of the auxiliary polynomial which is in the auxiliary memory 166, and it also accepts the second discrepancy which is in the second discrepancy register 172, so as to multiply the two; then, the first adder 152 adds up the product of the multiplication and a coefficient of the temporal errata locator polynomial, which is in the errata locator polynomial memory 162, to obtain a new coefficient of the temporal errata locator polynomial and to store that into the first register 158.

In other word, in another embodiment of the present invention, the temporal auxiliary polynomial calculating unit 186 completes two coefficient calculations of the temporal errata locator polynomial in a single clock cycle.

However, if there are enough multipliers, adders, and registers, the temporal auxiliary polynomial calculating unit 186 can complete more than two coefficient calculations of the temporal errata locator polynomial in a single clock cycle.

The discrepancy calculating unit 188, which comprises at least two multipliers, an adder, and a register, calculates each of the coefficients of the errata evaluator polynomial. In the second embodiment of the present invention, the discrepancy calculating unit 188 comprises a fifth multiplier 148 and a sixth multiplier 150. The calculation of the discrepancy is implemented by the fifth multiplier 148 and the sixth multiplier 150, in which the fifth multiplier 148 accepts a coefficient of the Forney syndrome polynomial which is in the Forney syndrome memory 164, and the sixth multiplier 150 accepts a coefficient of the temporal errata locator polynomial which is calculated from the temporal errata locator polynomial calculating unit 186, so as to calculate the multiplication of the two and to obtain at least two decomposed data. Then, the adder 156 adds up the decomposed data and a registered result, which is last stored in the register 174 in order to obtain a corresponding add up result and to further update the result of the register 174 by the newly add up result. The above mentioned multiplication and addition is completed in a single clock cycle.

The temporal auxiliary polynomial calculating unit 190 updates the auxiliary polynomial of the auxiliary memory 166 by using an auxiliary determinator 176, wherein the determinator 176 comprises a determination module which stores an auxiliary degree variable. The determination module, according to the value of the discrepancy in the second discrepancy register 172 and the auxiliary degree variable which is stored in the auxiliary determinator 176, determines whether the auxiliary polynomial in the auxiliary memory 166 should be replaced by the original auxiliary polynomial after being phase-shifted, or be replaced by the present coefficient of the temporal errata locator polynomial after being multiplied by the reciprocal of a discrepancy.

3. The Third Preferred Embodiment

The Euclidean Algorithm

Referring to FIG. 11, FIG. 11 is the errata locator polynomial generating circuit and errata evaluator polynomial generating circuit, that are based on the Euclidean Algorithm, of a preferred embodiment of the present invention. The key equation polynomial generator in FIG. 11 is designed in accordance with the Euclidean Algorithm, in which the key equation polynomial generator is capable of calculating the errata locator polynomial and the errata evaluator polynomial. Here, the calculation of a coefficient in a single clock cycle by the Euclidean Algorithm is shown as below:
Initializations:
$(\mu^{(0)}(x)=\Lambda(x)\ R^{(0)}(x)=x^{2t}$
$\lambda^{(0)}(x)=0\ Q^{(0)}(x)=T(x)=S(x)\Lambda(x)\ \mathrm{mod}\ x^{2t}$
Compute the following iterations:

```
for (i = 0 to t)
    if ( deg(λ^(i-1)(x)) ≤ deg( R^(i-1)(x)))
        for j = 0 to j ≤ deg( R^(i-1)(x)); j = j + 1 begin
            R_j^(i) = [κ_{i-1}b_{i-1}R_j^(i-1) + κ̄_{i-1}a_{i-1}Q_j^(i-1)] + [κ_{i-1}a_{i-1}Q_{j-l_{i-1}}^(i-1) +
                κ̄_{i-1}b_{i-1}R_{j-l_{i-1}}^(i-1)]
            λ_j^(i) = [κ_{i-1}b_{i-1}λ_j^(i-1) + κ̄_{i-1}a_{i-1}μ_j^(i-1)] + [κ_{i-1}a_{i-1}μ_{j-l_{i-1}}^(i-1) +
                κ̄_{i-1}b_{i-1}λ_{j-l_{i-1}}^(i-1)]
            Q_j^(i) = κ_{i-1}a_{i-1}Q_j^(i-1) + κ̄_{i-1}b_{i-1}R_j^(i-1)
            μ_j^(i) = κ_{i-1}a_{i-1}μ_j^(i-1) + κ̄_{i-1}b_{i-1}λ_j^(i-1)
        end loop
    end if
end loop
``` where $a_{i-1}$ and $b_{i-1}$ are the leading coefficients of $R^{(i-1)}(X)$ and $Q^{(i-1)}(X)$, respectively $l_{i-1}=\deg(R^{(i-1)}(x))-\deg(Q^{(i-1)}(x))$ and $\kappa_{i-1}=1\ \bar{\kappa}_{i-1}=0\ \mathrm{if}\ l_{i-1}\geq 0$ $\kappa_{i-1}=0\ \bar{\kappa}_{i-1}=1\ \mathrm{if}\ l_{i-1}<0$ the errata locator polynomial $\sigma(x)=\lambda^{(i)}(x)$
the errata evaluator polynomial $\Omega(x)=R^{(i)}(x)$
wherein Rj(i) is the jth coefficient of the ith iteration of R(i)(x), and when j<0, Rj<0(i)=0λj<0(i)=0.

For the reason that the example of the embodiment calculates two coefficients or two decomposed data in a single clock cycle, the Euclidean Algorithm is rewritten as below:
Initializations:
$(\mu^{(0)}(x)=\Lambda(x)\ R^{(0)}(x)=x^{2t}$
$\lambda^{(0)}(x)=0\ Q^{(0)}(x)=T(x)=S(x)\Lambda(x)\ \mathrm{mod}\ x^{2t}$
Compute the following iterations:
for i=0 to t

```
if ( deg(λ^(i-1)(x)) ≤ deg(R^(i-1)(x)))
    for j = 0 to j ≤ deg (R^(i-1)(x)); j = j + 2 begin
        R_j^(i) = [κ_{i-1}b_{i-1}R_j^(i-1) + κ̄_{i-1}a_{i-1}Q_j^(i-1)] + [κ_{i-1}a_{i-1}Q_{j-l_{i-1}}^(i-1) +
            κ̄_{i-1}b_{i-1}R_{j-l_{i-1}}^(i-1)]
        R_{j+1}^(i) = [κ_{i-1}b_{i-1}R_{j+1}^(i-1) + κ̄_{i-1}a_{i-1}Q_{j+1}^(i-1)] + κ_{i-1}a_{i-1}Q_{j+1-l_{i-1}}^(i-1) +
            κ̄_{i-1}b_{i-1}R_{j+1-l_{i-1}}^(i-1)]
        λ_j^(i) = [κ_{i-1}b_{i-1}λ_j^(i-1) + κ̄_{i-1}a_{i-1}μ_j^(i-1)] + [κ_{i-1}a_{i-1}μ_{j-l_{i-1}}^(i-1) +
            κ̄_{i-1}b_{i-1}λ_{j-l_{i-1}}^(i-1)]
        λ_{j+1}^(i) = [κ_{i-1}b_{i-1}λ_{j+1}^(i-1) + κ̄_{i-1}a_{i-1}μ_{j+1}^(i-1)] + [κ_{i-1}a_{i-1}μ_{j+1-l_{i-1}}^(i-1) +
            κ̄_{i-1}b_{i-1}λ_{j+1-l_{i-1}}^(i-1)]
        Q_j^(i) = κ_{i-1}a_{i-1}Q_j^(i-1) + κ̄_{i-1}b_{i-1}R_j^(i-1)
        Q_{j+1}^(i) = κ_{i-1}a_{i-1}Q_{j+1}^(i-1) + κ̄_{i-1}b_{i-1}R_{j+1}^(i-1)
        μ_j^(i) = κ_{i-1}a_{i-1}μ_j^(i-1) + κ̄_{i-1}b_{i-1}λ_j^(i-1)
        μ_{j+1}^(i) = κ_{i-1}a_{i-1}μ_{j+1}^(i-1) + κ̄_{i-1}b_{i-1}λ_{j+1}^(i-1)
    end loop
end if
end loop
``` where $a_{i-1}$ and $b_{i-1}$ are the leading coefficients of $R^{(i-1)}(X)$ and $Q^{(i-1)}(X)$, respectively $l_{i-1}=\deg(R^{(i-1)}(x))-\deg(Q^{(i-1)}(x))$ and $\kappa_{i-1}=1\ \bar{\kappa}_{i-1}=0\ \mathrm{if}\ l_{i-1}\geq 0$ $\kappa_{i-1}=0\ \bar{\kappa}_{i-1}=1\ \mathrm{if}\ l_{i-1}<0$ the errata locator polynomial $\sigma(x)=\lambda^{(i)}(x)$
the errata evaluator polynomial $\Omega(x)=R^{(i)}(x)$
wherein Rj(i) is the jth coefficient of the ith iteration of R(i)(x), and when Rj<0(i)=0 λj<0(i)=0.

There are many differences between the Euclidean Algorithm and the two types of Inverseless and Inverse Berlekamp-Massey Algorithm mentioned before; to get more understanding of the Euclidean Algorithm, please refer to the periodical: Howard M. Shao and Irving S. Reed, "On the VLSI Design of a Pipeline Reed-Solomon Decoder Using Systolic Arrays," IEEE Trans on Computers, VOL. 37, NO. 10, October 1998.

The Euclidean key equation polynomial generating circuit of the preferred embodiment comprises an errata locator polynomial generating circuit and an errata evaluator polynomial generating circuit, in which the generating circuits further comprise some memory to form a memory module. The so-called memory module comprises: a Forney Syndrome memory for accepting a plurality of Forney Syndromes $T(x)=S(x)\Lambda(x) \bmod x^{2t}$, and for storing that into the Forney Syndromes memory to be the initial value of the Forney Syndrome polynomial: $Q^{(0)}(x)=T(x)$; an erasure memory for accepting a plurality of erasures and further storing that into the erasure memory to be an initial value of the erasure polynomial: $\mu^{(0)}(x)=\Lambda(x)$; an errata locator polynomial memory for storing an initialized errata locator polynomial through an initialization procedure: $\lambda^{(0)}(x)=0$; and an errata evaluator polynomial memory for storing an initialized errata evaluator polynomial through an initialization procedure: $R^{(0)}(x)=x^{2t}$.

The Euclidean key equation polynomial generating circuit of the preferred embodiment, based on the Euclidean calculation procedure, updates at least two coefficients of the errata locator polynomial in a single clock cycle and updates at least two coefficients of the errata evaluator polynomial. The errata locator polynomial is obtained from the calculation of the errata locator polynomial generating circuit while the errata evaluator polynomial is obtained from the calculation of the errata evaluator polynomial generating circuit.

Beside the Forney Syndrome memory 224 and the errata evaluator polynomial memory 226, the errata evaluator polynomial generating circuit 194 further comprises a first multiplier 196, a second multiplier 198, a third multiplier 200, a fourth multiplier 202, a first adder 204, a second adder 206, a first multiplexer 208, a second multiplexer 210, a third multiplexer 212, a fourth multiplexer 214, a fifth multiplexer 216, a sixth multiplexer 218, a first register 220, and a second register 222 to calculate every coefficient of the errata evaluator polynomial, in which each of the coefficients of the errata evaluator polynomial is added up from a plurality of decomposed data. In the calculating procedure of the errata evaluator polynomial generating circuit, in accordance with the Euclidean calculation procedure, the highest order coefficient of the errata evaluator polynomial that is currently stored in the errata evaluator polynomial memory 226 will then be temporarily stored in the first register 220; and the highest order coefficient of the first auxiliary polynomial that is currently stored in the Forney Syndrome memory 224 will then be stored in the second register 222 in order to make it convenient for the errata evaluator polynomial generating circuit 194 to update the errata evaluator polynomial through the Euclidean calculation procedure.

Beside the erasure memory 258 and the errata locator polynomial memory 260, the errata locator polynomial generating circuit 232 further comprises a first multiplier 234, a second multiplier 236, a third multiplier 238, a fourth multiplier 240, a first adder 242, a second adder 244, a first multiplexer 246, a second multiplexer 248, a third multiplexer 250, a fourth multiplexer 252, a first register 254, and a second register 256 to calculate every coefficient of the errata locator polynomial, in which each of the coefficient of the errata locator polynomial is added up from a plurality of decomposed data. Because the calculation of the errata locator polynomial requires some parameters that are stored in the errata evaluator polynomial generating circuit 194, the highest order coefficient of the errata evaluator polynomial that is currently stored in the errata evaluator polynomial memory 226 will then be temporarily stored into the first register 254 of the errata locator polynomial generating circuit 232; the highest order coefficient of the first auxiliary polynomial that is currently stored in the Forney Syndrome memory 224 will then be stored into the second register 256 of the errata locator polynomial generating circuit 232. For the simplification of the circuit, the first register 254 and the second register 256 of the errata locator polynomial generating circuit 232 can be respectively merged with the first register 220 and the second register 222 of the errata evaluator polynomial generating circuit 194. The above mentioned design and arrangement of the circuit is capable of updating the errata locator polynomial of the errata locator polynomial generating circuit 232 through the Euclidean calculation procedure.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A data decoding method of calculating an errata locator polynomial of key equation polynomials in a decoder, the key equation polynomials comprising the errata locator polynomial and an errata evaluator polynomial, the errata locator polynomial comprising a plurality of coefficient calculations, some or all of the plurality of coefficients being formed by adding up a plurality of decomposed data, the method comprising:

obtaining, by a circuit of the decoder, the errata locator polynomial by providing a coefficient calculation procedure to simultaneously update at least two of the coefficients, or at least two of the decomposed data, or a combination thereof in a single clock cycle of the coefficient calculation procedure, wherein the key equation polynomials are calculated according to the following formula:

$$\omega(x) = S(x)\sigma(x)$$
$$= (S_0\sigma_0) + (S_1\sigma_0 + S_0\sigma_1)x + (S_2\sigma_0 + S_1\sigma_1 + S_0\sigma_2)x^2 + \ldots$$

wherein $S(x)$ and $\sigma(x)$ are two polynomials, and $\omega(x)$ is the multiplication of $S(x)$ and $\sigma(x)$, and the calculation of $\omega(x)$ is capable of computing at least two decomposed data or calculating at least two coefficients of the polynomial $\omega(x)$ simultaneously or calculating a combination of the above.

2. The method of claim 1, wherein the coefficient calculation procedure for the errata locator polynomial is an Inverseless Berlekamp-Massey algorithm, the method comprising:

providing a discrepancy calculation unit for reading coefficients of a syndrome polynomial or a Forney syndrome polynomial, and for reading coefficients of a temporary errata locator polynomial to calculate a discrepancy;

providing a temporal errata locator polynomial calculation unit for reading the discrepancy and coefficients of the temporal errata locator polynomial and a temporal auxiliary polynomial to perform the coefficient calculation for the temporal errata locator polynomial; and providing a temporal auxiliary polynomial calculation unit for reading coefficients of the temporal errata locator polynomial and the temporal auxiliary polynomial to update the temporal auxiliary polynomial.

3. The method of claim 2, wherein the discrepancy calculation unit is used for accepting in a single clock cycle at least two coefficients of the syndrome polynomial or the Forney syndrome polynomial, and at least two coefficients of the temporal errata locator polynomial to calculate the discrepancy.

4. The method of claim 2, wherein the temporal errata locator polynomial calculation unit performs calculation of at least two coefficients of the temporal errata locator polynomial in a single clock cycle.

5. The method of claim 2, wherein the temporal auxiliary polynomial calculation unit performs calculation of at least two coefficients of the temporal auxiliary polynomial in a single clock cycle and updates the auxiliary polynomial in an auxiliary memory by an auxiliary determinator, and wherein the auxiliary determinator comprises a determination module for storing an auxiliary degree variable, and the determination module determines according to the discrepancy and the auxiliary degree variable if the auxiliary polynomial in the auxiliary memory is to be replaced by an original auxiliary polynomial after a predetermined calculation or to be replaced by the current temporal errata locator polynomial.

6. The method of claim 1, wherein the coefficient calculation procedure for the errata locator polynomial is an Inverse Berlekamp-Massey algorithm, the method comprising:
providing a discrepancy calculation unit for reading coefficients of a syndrome polynomial or a Forney syndrome polynomial, and for reading coefficients of a temporal errata locator polynomial to calculate a discrepancy;
providing a temporal errata locator polynomial calculation unit for reading the discrepancy and coefficients of the temporal errata locator polynomial and a temporal auxiliary polynomial to perform coefficient calculation of the temporal errata locator polynomial;
providing a temporal auxiliary polynomial calculation unit for reading coefficients of the temporal errata locator polynomial and the temporal auxiliary polynomial to update the temporal auxiliary polynomial; and
providing an inverse calculation unit for reading the discrepancy and calculating the inverse of the discrepancy.

7. The method of claim 6, wherein the discrepancy calculation unit is used for accepting in a single clock cycle at least two coefficients of the syndrome polynomial or the Forney syndrome polynomial, and at least two coefficients of the temporal errata locator polynomial to calculate the discrepancy.

8. The method of claim 6, wherein the temporal errata locator polynomial calculation unit performs calculations of at least two coefficients of the temporal errata locator polynomial in a single clock cycle.

9. The method of claim 6, wherein the temporal auxiliary polynomial calculation unit performs calculation of at least two coefficients of the temporal auxiliary polynomial in a single clock cycle and updates the auxiliary polynomial in an auxiliary memory by an auxiliary determinator, and wherein the auxiliary determinator comprises a determination module for storing an auxiliary degree variable, and the determination module determines according to the discrepancy and the auxiliary degree variable if the auxiliary polynomial in the auxiliary memory is to be replaced by an original auxiliary polynomial after a predetermined calculation or to be replaced by the current temporal errata locator polynomial.

10. The method of claim 1, wherein the coefficient calculation procedure for the errata locator polynomial is an Euclidean algorithm, the method comprising:
providing a coefficient generating unit for reading in a single clock cycle at least two coefficients of a temporal errata locator polynomial, at least two coefficients of a second auxiliary polynomial, the coefficient of the highest degree of a first auxiliary polynomial, and the coefficient of the highest degree of a temporal errata evaluator polynomial to obtain at least two coefficients of the temporal errata locator polynomial; and
providing an auxiliary determinator for determining if the coefficients of the temporal errata locator polynomial and the second auxiliary polynomial are to switch their positions with each other.

11. A data decoding method of calculating an errata evaluator polynomial of key equation polynomials in a decoder, the key equation polynomials comprising an errata locator polynomial and the errata evaluator polynomial, the errata evaluator polynomial comprising a plurality of coefficient calculations, some or all of the plurality of coefficients being formed by adding up a plurality of decomposed data, the method comprising:
providing, by a circuit of the decoder, a coefficient calculation procedure for the errata evaluator polynomial by simultaneously updating at least two of the coefficients, or at least two of the decomposed data, or a combination thereof, in a single clock cycle of the coefficient calculation procedure to obtain the errata evaluator polynomial,
wherein the key equation polynomials are calculated according to the following formula:

$$\omega(x) = S(x)\sigma(x)$$
$$= (S_0\sigma_0) + (S_1\sigma_0 + S_0\sigma_1)x + (S_2\sigma_0 + S_1\sigma_1 + S_0\sigma_2)x^2 + \ldots$$

wherein $S(x)$ and $\sigma(x)$ are two polynomials, and $\omega(x)$ is the multiplication of $S(x)$ and $\sigma(x)$, and the calculation of $\omega(x)$ is capable of computing at least two decomposed data or calculating at least two coefficients of the polynomial $\omega(x)$ simultaneously or calculating a combination of the above.

12. The method of claim 11, wherein the method comprises:
according to the coefficient calculation procedure for the errata evaluator polynomial, the errata evaluator polynomial is obtained by the multiplication of a Syndrome polynomial and the errata locator polynomial; wherein each coefficient of the errata evaluator polynomial being formed by adding up a plurality of decomposed data, and the decomposed data is the multiplication of coefficients of the Syndrome polynomial and the errata locator polynomial.

13. The method of claim 11, wherein the coefficient calculation procedure for the errata evaluator polynomial is an Euclidean algorithm, the method comprising:
providing a coefficient generating unit for reading in a clock cycle at least two coefficients of a temporal errata evaluator polynomial, at least two coefficients of a first auxiliary polynomial, the coefficient of the highest degree of the first auxiliary polynomial, and the coefficient of the highest degree of the temporal errata evaluator polynomial to obtain at least two coefficients of the temporal errata evaluator polynomial; and providing an auxiliary determinator for determining if the coefficients of the temporal errata evaluator polynomial and the first auxiliary polynomial are to switch their positions with each other.

14. A system of calculating an errata locator polynomial of key equation polynomials in a decoder, the key equation polynomials comprising the errata locator polynomial and an errata evaluator polynomial, the errata locator polynomial comprising a plurality of coefficients calculation, some or all of the plurality of coefficients being formed by adding up a plurality of decomposed data, the system comprising:

a circuit for generating a coefficient calculation procedure for the errata locator polynomial, and simultaneously updating at least two of the coefficients, or at least two of the decomposed data, or a combination thereof in a clock cycle of the coefficient calculation procedure to obtain the errata locator polynomial, wherein the key equation polynomials are calculated according to the following formula:

$$\omega(x) = S(x)\sigma(x)$$
$$= (S_0\sigma_0) + (S_1\sigma_0 + S_0\sigma_1)x + (S_2\sigma_0 + S_1\sigma_1 + S_0\sigma_2)x^2 + \ldots$$

wherein $S(x)$ and $\sigma(x)$ are two polynomials, and $\omega(x)$ is the multiplication of $S(x)$ and $\sigma(x)$, and the calculation of $\omega(x)$ is capable of computing at least two decomposed data or calculating at least two coefficients of the polynomial $\omega(x)$ simultaneously or calculating a combination of the above.

15. The system of claim 14, wherein the coefficient calculation procedure for the errata locator polynomial is an Inverseless Berlekamp-Massey algorithm, the system comprising:

a discrepancy calculation unit for reading coefficients of a syndrome polynomial or a Forney syndrome polynomial, and for reading coefficients of a temporal errata locator polynomial to calculate a discrepancy;

a temporal errata locator polynomial calculation unit for reading the discrepancy and the coefficient of the temporal errata locator polynomial and a temporal auxiliary polynomial to perform coefficient calculation for the temporal errata locator polynomial; and a temporal auxiliary polynomial calculation unit for reading coefficient of the temporal errata locator polynomial and the temporal auxiliary polynomial to update the temporal auxiliary polynomial.

16. The system of claim 15, wherein the discrepancy calculation unit is used for accepting in a single clock cycle at least two coefficients of the syndrome polynomial or the Forney syndrome polynomial, and at least two coefficients of the temporal errata locator polynomial to calculate discrepancy.

17. The system of claim 15, wherein the temporal errata locator polynomial calculation unit performs calculation of at least two coefficients of the temporal errata locator polynomial in a single clock cycle.

18. The system of claim 15, wherein the temporal auxiliary polynomial calculation unit performs calculation of at least two coefficients of the temporal auxiliary polynomial in a single clock and updates the auxiliary polynomial in the auxiliary memory by an auxiliary determinator, and wherein the auxiliary determinator comprises a determination module for storing an auxiliary degree variable, and the determination module determines according to the discrepancy and the auxiliary degree variable if the auxiliary polynomial in the auxiliary memory is to be replaced by an original auxiliary polynomial after a predetermined calculation or to be replaced by the current temporal errata locator polynomial.

19. The system of claim 14, wherein the coefficient calculation procedure for the errata locator polynomial is an Inverse Berlekamp-Massey algorithm, the system comprising:

a discrepancy calculation unit for reading coefficients of a syndrome polynomial or a Forney syndrome polynomial, and for reading coefficient of a temporal errata locator polynomial to calculate a discrepancy;

a temporal errata locator polynomial calculation unit for reading the coefficient of the temporal errata locator polynomial and a temporal auxiliary polynomial to perform coefficient calculation of the temporal errata locator polynomial;

a temporal auxiliary polynomial calculation unit for reading the discrepancy and coefficient of the temporal errata locator polynomial and the temporal auxiliary polynomial to update the temporal auxiliary polynomial; and an inverse calculation unit for reading the discrepancy value and for calculating the inverse of the discrepancy.

20. The system of claim 19, wherein the discrepancy calculation unit is used for accepting in a single clock cycle at least two coefficients of the syndrome polynomial or the Forney syndrome polynomial, and at least two coefficients of the temporal errata locator polynomial to calculate the discrepancy.

21. The system of claim 19, wherein the temporal errata locator polynomial calculation unit performs calculation of at least two coefficients of the temporal errata locator polynomial in a single clock.

22. The system of claim 19, wherein the auxiliary polynomial calculation unit performs calculation of at least two coefficients of the temporal auxiliary polynomial in a single clock, and updates the auxiliary polynomial in the auxiliary memory by an auxiliary determinator, and wherein the auxiliary determinator comprises a determination module for storing an auxiliary degree variable, and the determination module determines according to the discrepancy and the auxiliary degree variable if the auxiliary polynomial in the auxiliary memory is to be replaced by an original auxiliary polynomial after a predetermined calculation or to be replaced by the current temporal errata locator polynomial.

23. The system of claim 14, wherein the circuit for generating the coefficient calculation procedure for the errata locator polynomial further comprises:

a Forney syndrome memory for accepting a plurality of Forney syndromes and for storing the plurality of Forney syndromes in the Forney syndrome memory according to priority to form a Forney syndrome polynomial;

an erasure memory for accepting a plurality of erasures and for storing the plurality of erasures in the erasure memory according to priority to form an erasure polynomial;

an errata locator polynomial memory for storing an initial errata locator polynomial through an initialized procedure; and an errata evaluator polynomial memory for storing an initial evaluator locator polynomial through an initialized procedure;

wherein a key equation polynomial generator, according to an Euclidean calculation procedure, simultaneously updates in a single clock cycle at least two coefficients of the errata locator polynomial, or at least two coefficients of the errata evaluator polynomial, or a combination thereof, and repeat the steps until the errata locator polynomial and the errata evaluator polynomial are obtained.

24. The system of claim 23, wherein the errata locator polynomial is calculated by an errata locator polynomial generating circuit, and the errata evaluator polynomial is calculated by an errata evaluator polynomial generating circuit.

25. The system of claim 23, wherein the errata locator polynomial generating circuit comprises:
   a coefficient generating unit for reading a coefficient of the temporal errata evaluator polynomials a coefficient of a second auxiliary polynomial, coefficient of the highest degree of a first auxiliary polynomial, and coefficient of the highest degree of a temporal errata evaluator polynomial to obtain the coefficients of the temporal errata locator polynomial and the second auxiliary polynomial; and
   an auxiliary determinator for reading and determining if the coefficient of the temporal errata evaluator polynomial and the second auxiliary polynomial switch their positions with each other.

26. A system of calculating an errata evaluator polynomial of key equation polynomials in a decoder, the key equation polynomials comprising an errata locator polynomial and the errata evaluator polynomial, the errata evaluator polynomial comprising a plurality of coefficients calculation, some or all of the plurality of coefficients is being formed by adding up a plurality of decomposed data, the system comprising:
   a circuit for generating coefficient calculation procedure for the errata evaluator polynomial, and simultaneously updating at least two of the coefficient, or at least two of the decomposed data in a clock cycle of the coefficient calculation procedure for obtaining the errata evaluator polynomial,
   wherein the key equation polynomials are calculated according to the following formula:

$$\omega(x) = S(x)\sigma(x)$$
$$= (S_0\sigma_0) + (S_1\sigma_0 + S_0\sigma_1)x + (S_2\sigma_0 + S_1\sigma_1 + S_0\sigma_2)x^2 + \ldots$$

wherein $S(x)$ and $\sigma(x)$ are two polynomials, and $\omega(x)$ is the multiplication of $S(x)$ and $\sigma(x)$, and the calculation of $\omega(x)$ is capable of computing at least two decomposed data or calculating at least two coefficients of the polynomial $\omega(x)$ simultaneously or calculating a combination of the above.

27. The system of claim 26, wherein the circuit for generating coefficient calculation procedure for the errata evaluator polynomial further comprises:
   according to the coefficient calculation procedure for the errata evaluator polynomial, the errata evaluator polynomial is the multiplication of the Syndrome polynomial and the errata locator polynomial;
   wherein each coefficient of the errata evaluator polynomial being formed by adding up a plurality of decomposed data, and the decomposed data is the multiplication of the coefficients of the Syndrome polynomial and the errata locator polynomial.

28. The system of claim 26, wherein the circuit for generating the coefficient calculation procedure for the errata evaluator polynomial further comprises:
   a Forney syndrome memory for accepting a plurality of Forney syndromes and for storing in the Forney syndrome memory according to priority to form a Forney syndrome polynomial;
   an erasure memory for accepting a plurality of erasures and for storing in the erasure memory according to priority to form an erasure polynomial;
   an errata locator polynomial memory for storing an initial errata locator polynomial through an initialized procedure; and
   an errata evaluator polynomial memory for storing an initial errata evaluator polynomial by the initialized procedure;
   wherein a key equation polynomial generator, according to an Euclidean calculation procedure, simultaneously updates in a single clock cycle at least two coefficients of the errata locator polynomial, or at least two coefficients of the errata evaluator polynomial, or a combination thereof, and repeat the steps until the errata locator polynomial and the errata evaluator polynomial are obtained.

29. The system of claim 28, wherein the errata locator polynomial is calculated by an errata locator polynomial generating circuit, and the errata evaluator polynomial is calculated by an errata evaluator polynomial generating circuit.

30. The system of claim 28, wherein the circuit for generating the errata evaluator polynomial comprises:
   a coefficient generating unit for reading a coefficient of the temporal errata evaluator polynomials a coefficient of a first auxiliary polynomials coefficient of the highest degree of the first auxiliary polynomial, and coefficient of the highest degree of the temporal errata evaluator polynomial to obtain the coefficients of the temporal errata evaluator polynomial and the first auxiliary polynomial; and
   an auxiliary determinator for reading and determining if the coefficient of the temporal errata evaluator polynomial and the first auxiliary polynomial switch their positions with each other.

31. A data decoding method of calculating key equation polynomials in a decoder, the key equation polynomials comprising an errata locator polynomial and an errata evaluator polynomial, the errata locator polynomial comprising a plurality of coefficient calculations, some or all of the plurality of coefficients being formed by adding up a plurality of decomposed data, the method comprising:
   obtaining, by a circuit of the decoder, the errata locator polynomial by providing a coefficient calculation procedure to simultaneously update at least two of the coefficients, or two of the decomposed data, or a combination thereof in a single clock cycle of the coefficient calculation procedure,
   wherein the key equation polynomials are calculated according to the following formula:

$$\Delta = \sum_{j=0}^{m} \mu_j T_{n-j}$$
$$= \mu_m T_{n-m} + \mu_{m-1} T_{n-m+1} + \ldots + \mu_2 T_{n-2} + \mu_1 T_{n-1} + \mu_0 T_n$$

wherein $\mu(x)$ and $T(x)$ are two polynomials, $\mu_m$ is m order coefficient of $\mu(x)$, $T_n$ is n order coefficient of $T(x)$, and $\Delta$ is a coefficient calculating result of the two polynomials.

32. A data decoding method of calculating key equation polynomials in a decoder, the key equation polynomials comprising an errata locator polynomial and an errata evaluator polynomial, the errata locator polynomial comprising a plurality of coefficient calculations, some or all of the plurality of coefficients being formed by adding up a plurality of decomposed data, the method comprising:

obtaining, by a circuit of the decoder, the errata locator polynomial by providing a coefficient calculation procedure to simultaneously update at least two of the coefficients, or two of the decomposed data, or a combination thereof in a single clock cycle of the coefficient calculation procedure, wherein the key equation polynomials are calculated according to the following formula:

$$Y(x)=aP(x)+bQ(x)x^k$$

wherein $P(x)$ and $Q(x)$ are two polynomials, and a, b and k are finite field constants, and the calculation of $Y(x)$ is capable of computing at least two decomposed data or calculating at least two coefficients of the polynomial $Y(x)$ simultaneously or calculating a combination of the above.

* * * * *